(12) United States Patent
Chen

(10) Patent No.: US 6,449,151 B1
(45) Date of Patent: Sep. 10, 2002

(54) HEAT SINK ASSEMBLY HAVING FASTENING MEANS FOR ATTACHING FAN TO HEAT SINK

(75) Inventor: Chun-Chi Chen, Shenzhen (CN)

(73) Assignee: Foxconn Precision Components Co., Ltd., Taipei Hsien (TW)

( * ) Notice: Subject to any disclaimer, the term of this patent is extended or adjusted under 35 U.S.C. 154(b) by 0 days.

(21) Appl. No.: 09/882,891

(22) Filed: Jun. 15, 2001

(51) Int. Cl.[7] .................................................. H05K 7/20
(52) U.S. Cl. ........................ 361/697; 24/458; 257/722
(58) Field of Search ........................ 257/722; 454/184; 312/236; 361/690, 694, 695, 697, 703, 704, 717–719, 722; 415/177, 178, 213.1, 214.1; 248/316.7, 505, 510; 124/16.3; 165/80.3, 185, 121–126; 24/453, 457, 458, 625

(56) References Cited

U.S. PATENT DOCUMENTS

| | | | | |
|---|---|---|---|---|
| 5,677,829 A | * | 10/1997 | Clemens | 361/697 |
| 5,761,041 A | * | 6/1998 | Hassanzadeh et al. | 613/704 |
| 5,864,464 A | * | 1/1999 | Lin | 361/697 |
| 5,982,622 A | * | 11/1999 | Chiou | 361/704 |
| 6,017,185 A | * | 1/2000 | Kuo | 415/177 |
| 6,118,657 A | * | 9/2000 | Clemens | 361/697 |
| 6,327,148 B1 | * | 12/2001 | Tucker et al. | 361/704 |

* cited by examiner

*Primary Examiner*—Gerald Tolin
(74) *Attorney, Agent, or Firm*—Wei Te Chung

(57) ABSTRACT

A heat sink assembly includes a heat sink (10), a frame (30), a fan (50), and a fastener (70). The heat sink has a pair of diagonally opposite vertical poles (20). An annular step (201) is formed on each pole at a position higher than a top extremity of fins (107) of the heat sink. An annular groove (203) is defined in the vicinity of a top end of each pole. The frame has a central opening (303), and a pair of apertures (301) at diagonally opposite corners of the frame. Four through hole (501) are defined in four corners of the fan. The fastener has two mutually perpendicular fixing arms (702). Each fixing arm defines a semicircular cutout (705) at an inner edge of a free end thereof. The fixing arms at the cutouts engage in the grooves of the poles, thereby securing the fan to the heat sink.

15 Claims, 3 Drawing Sheets

HEAT SINK ASSEMBLY HAVING FASTENING MEANS FOR ATTACHING FAN TO HEAT SINK

BACKGROUND OF THE INVENTION

1. Field of the invention

The present invention relates to cooling of electronic devices, and particularly to a heat sink assembly having a fixing device for readily and firmly attaching a fan to a heat sink.

2. Related art

Developments in today's highly information-intensive society have led to remarkable improvements in performances of electronic devices. During operation of many contemporary electronic devices, large amounts of heat are produced. Such heat must be efficiently removed from the electronic device, to prevent the system from becoming unstable or being damaged. Typically, a heat sink is attached to an outer surface of the device to facilitate removal of heat therefrom. A fan is often attached to the heat sink to provide forced air convection therefrom.

FIG. 3 shows a conventional heat sink assembly, which includes a heat sink 3, a fan 4 and a plurality of screws 5. The heat sink 3 has a base 31, and a plurality of heat dissipating fins 33 extending upwardly from the base 31. The fan 4 is essentially a rectangular box, with a through hole 41 defined in the vicinity of each corner thereof. In assembly, a tool such as a screwdriver (not shown) must be used to drive the screws 5 through the corresponding through holes 41 such that the screws 5 engage with the fins 33 of the heat sink 3. Disassembly also requires such tool, making these procedures unduly cumbersome and complicated. Furthermore, there is an industry trend whereby the fins 33 are being made thinner and thinner. Thus the fins 33 are more frequently being distorted or even damaged when the screws 5 are engaged therewith.

Therefore, an improved means of securing a fan to a heat sink which overcomes the above problems is desired.

BRIEF SUMMARY OF THE INVENTION

Accordingly, an object of the present invention is to provide a heat sink assembly having a fixing device which firmly and safely attaches a fan to a heat sink.

To achieve the above-mentioned object, a heat sink assembly comprises a heat sink, a frame, a fan, and a fastener. The heat sink has a pair of poles extending upwardly from diagonally opposite corners of a base thereof. An annular step is formed at an upper portion of each pole, at a position higher than a top extremity of fins of the heat sink. An annular groove is defined in the vicinity of a top end of each pole. The frame has a central opening, and a pair of apertures at diagonally opposite corners of the frame. A through hole is defined in each of four corners of the fan. The fastener has two mutually perpendicular fixing arms. Each fixing arm defines a semicircular cutout at an inner edge of a free end thereof. The fixing arms at the cutouts engage in the grooves of the poles, thereby securing the fan to the heat sink.

Other objects, advantages and novel features of the present invention will be drawn from the following detailed description of a preferred embodiment of the present invention together with the attached drawings, in which:

DESCRIPTION OF THE PREFERRED EMBODIMENT

Figure 1:
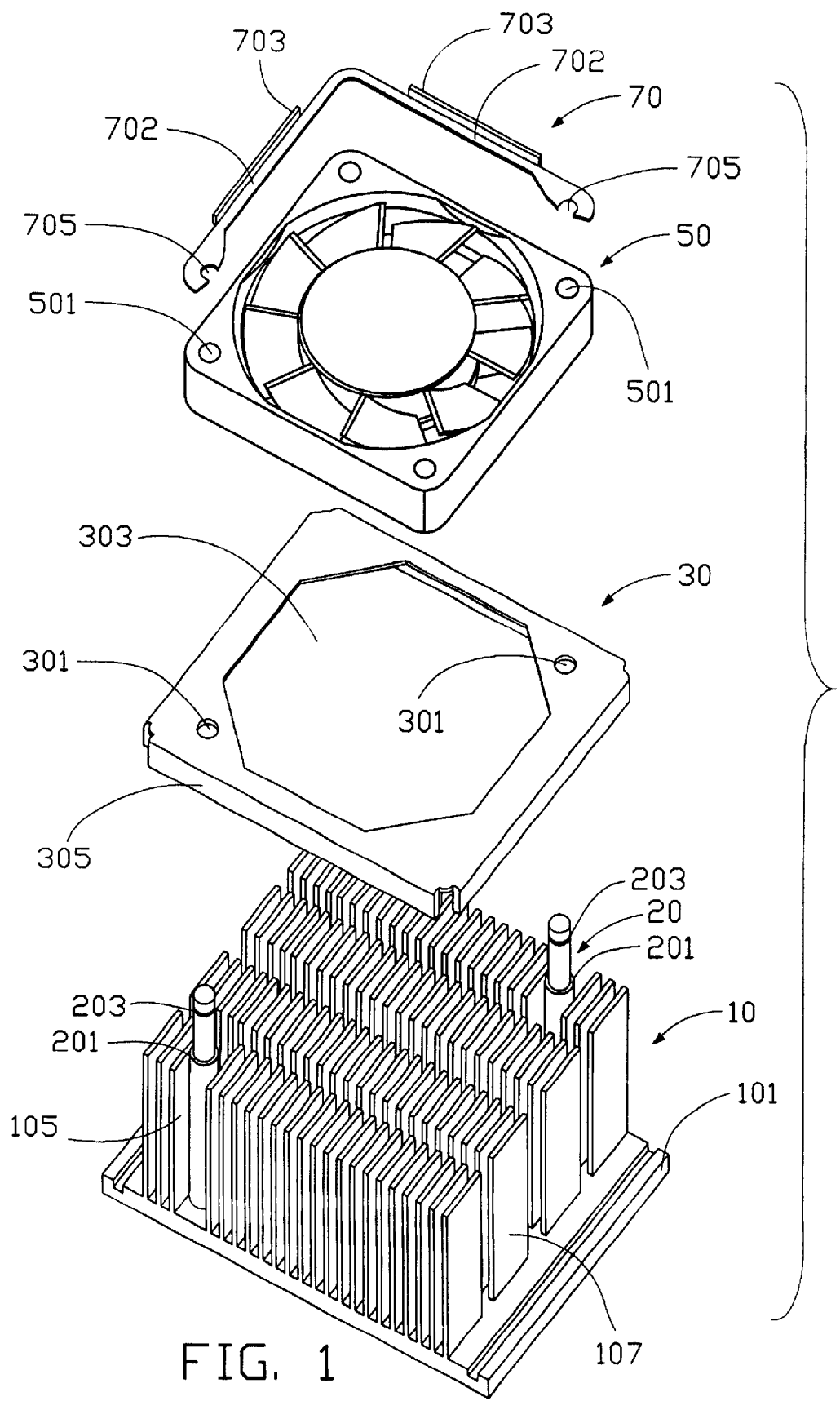
FIG. 1 is an exploded view of a heat sink assembly in accordance with the present invention.

Referring to FIG. 1, a heat sink assembly in accordance with the present invention comprises a heat sink 10, a fan 50, a frame 30 and a fastener 70. The heat sink 10 comprises a base 101, and a plurality of fins 107 extending upwardly from the base 101. A pair of diagonally opposite slots 105 is defined in the fins 107. A pair of poles 20 extends upwardly from the base 101 within the respective slots 105.

Each pole 20 forms an annular step 201 at an upper portion thereof. A cross-sectional area of each pole 20 above the step 201 is less than that of the pole 20 below the step 201. The step 201 is disposed slightly higher than a top extremity of the fins 107. An annular groove 203 is defined in the circumferential surface of each pole 20, in the vicinity of a top end of the pole 20.

The frame 30 is generally rectangular. An opening 303 is defined in a center of the frame 30, for providing airflow access for the fan 50. Four flanges 305 depend respectively from four edges of the frame 30. A pair of apertures 301 is defined respectively in diagonally opposite corners of the frame 30.

The fan 50 is generally box-shaped, and has a through hole 501 defined at each of four corners thereof.

The fastener 70 is a metal strip which is bent to form two mutually perpendicular fixing arms 702. A semicircular cutout 705 is defined in an inner edge of a free end of each fixing arm 702. A reinforcing beam 703 is formed upwardly from an outer edge of each fixing arm 702.

Figure 2:
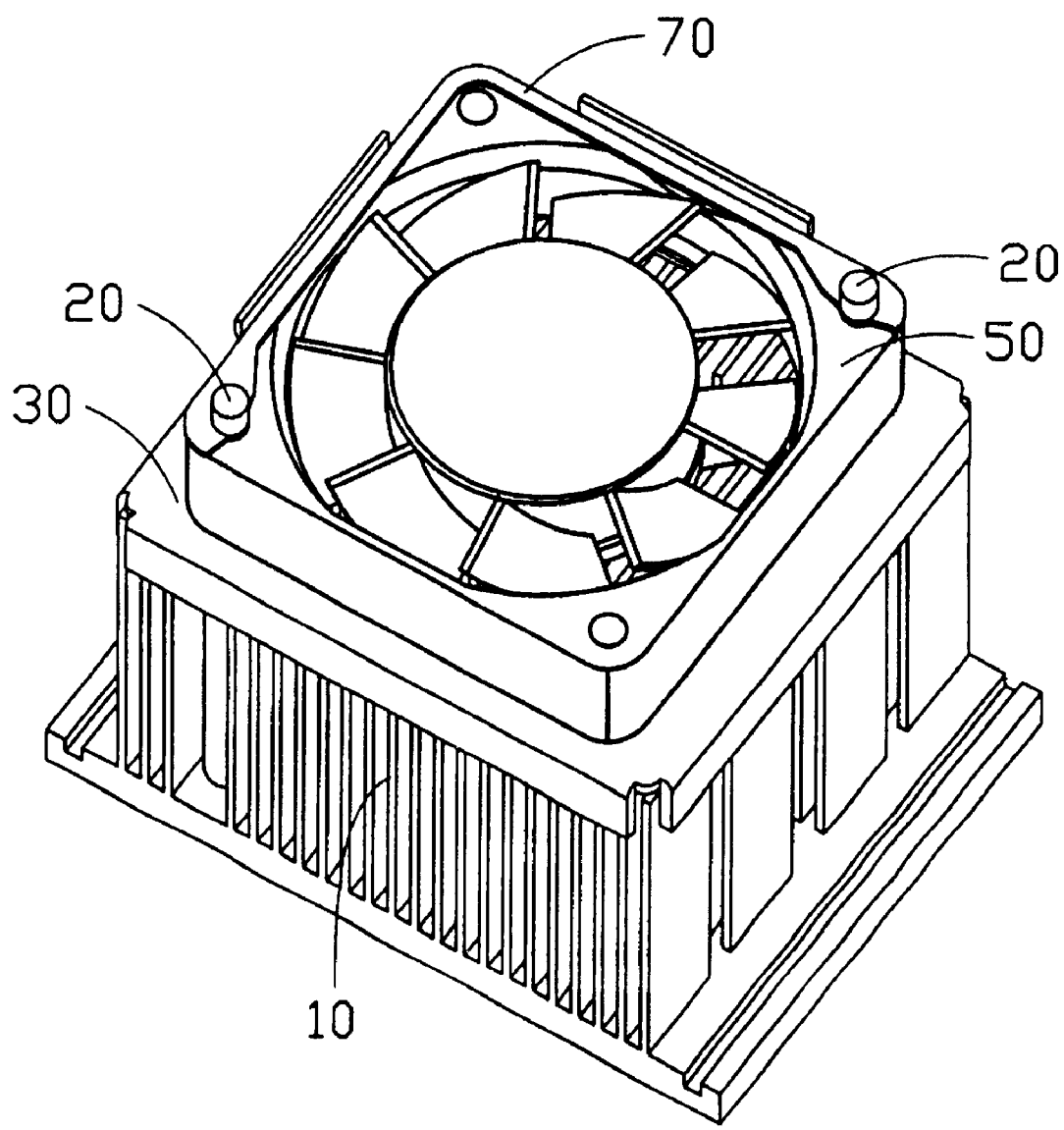
FIG. 2 is an assembled view of FIG. 1.
Figure 3:
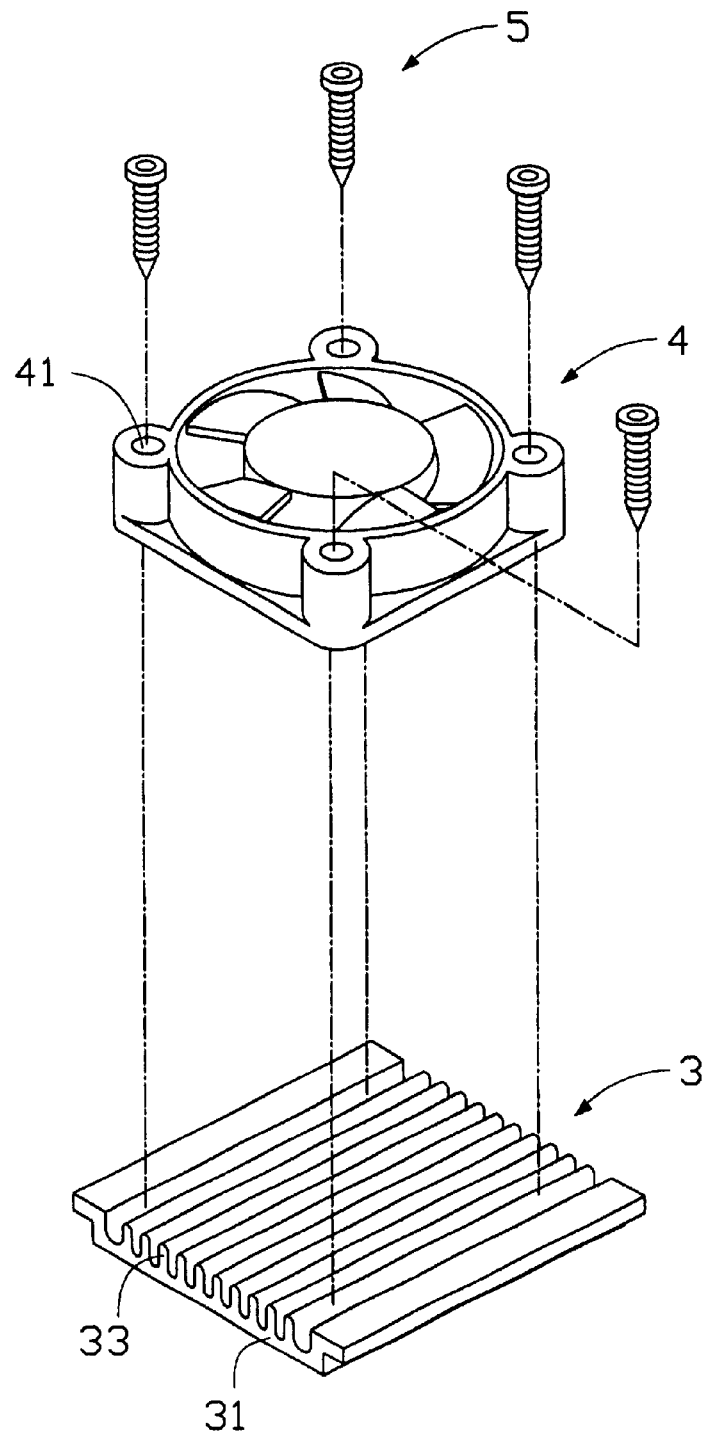
FIG. 3 is an exploded view of a conventional heat sink assembly.

Referring also to FIG. 2, in assembly, the frame 30 is placed onto the heat sink 10. The poles 20 of the heat sink 10 extend through the corresponding apertures 301 of the frame 30. The steps 201 of the poles 20 keep the frame 30 a predetermined distance from the top extremity of the fins 107. The flanges 305 abut against outmost fins 107, to prevent the frame 30 from tilting relative to the heat sink 10. The fan 50 is placed onto the frame 30, with the through holes 501 of the fan 50 receiving the corresponding poles 20 of the heat sink 10. The annular groove 203 of each pole 20 protrudes above a top face of the fan 50. The fixing arms 702 of the fastener 70 at the cutouts 705 are inserted into the corresponding annular grooves 203 of the poles 20. Thus the fan 50 is securely attached to the heat sink 10. In addition, the predetermined distance between the frame 30 and the top extremity of the fins 107 provides sufficient air space to achieve optimal heat dissipating efficiency.

It is understood that the invention may be embodied in other forms without departing from the spirit thereof. Thus, the present example and embodiment are to be considered in all respects as illustrative and not restrictive, and the invention is not to be limited to the details given herein.

What is claimed is:

1. A heat sink assembly comprising:
   a heat sink having a base, a plurality of fins extending from the base, and a pair of poles at diagonally opposite corners of the fins;
   a frame positioned on the heat sink, the frame defining a central opening and further defining a pair of apertures at opposite corners of the frame, the apertures receiving the poles of the heat sink;
   a fan attached to the frame, a pair of through holes being defined in opposite corners of the fan, the through holes receiving the poles of the heat sink; and a fastener placed onto the fan, the fastener comprising two fixing arms and engaging means on each fixing arm, the engaging means engaging with the corresponding poles of the heat sink and thereby fixing the fan to the heat sink.

2. The heat sink assembly as described in claim 1, wherein an annular step is formed at an upper portion of each pole.

3. The heat sink assembly as described in claim 2, wherein each step is higher than a top extremity of the fins, to support the frame and keep the frame a predetermined distance from the fins.

4. The heat sink assembly as described in claim 2, wherein an annular groove is defined in the vicinity of a top end of each pole, for engaging with the engaging means of the fastener.

5. The heat sink assembly as described in claim 1, wherein a pair of slots is defined in diagonally opposite corners of the fins, for accommodating the poles.

6. The heat sink assembly as described in claim 1, wherein the frame is rectangular and has a plurality of flanges depending from edges thereof.

7. The heat sink assembly as described in claim 1, wherein the fastener is a metal strip which is bent to form the fixing arms such that the fixing arms are mutually perpendicular.

8. The heat sink assembly as described in claim 1, wherein the engaging means comprises a semicircular cutout defined in an inner edge of a free end of each fixing arm.

9. The heat sink assembly as described in claim 1, wherein a reinforcing beam is formed upwardly from an outer edge of each fixing arm.

10. A heat sink assembly comprising:
- a heat sink comprising a base, a plurality of heat dissipating fins extending upwardly from the base, and at least one post extending upwardly from the base;
- a frame mounted to the at least one post; an electrical fan mounted on the frame, wherein the at least one post extends through the frame and also the fan; and
- a fastener fastened to a top end of the at least one post to fix the fan, frame and heat sink together.

11. The heat sink assembly as described in claim 10, wherein the at least one post defines an annular groove near its top end, and wherein the fastener is fastened to the top end of the at least one post by fittingly engaging in the annular groove.

12. The heat sink assembly as described in claim 10, wherein the at least one post forms a step located higher than a top extremity of the fins, and wherein the frame is mounted to the at least one post by sitting on the step.

13. The heat sink assembly as described in claim 10, wherein two posts extend upwardly from the base, each post defining an annular groove near its top end, and wherein the fastener has a generally L-shaped configuration with two outmost ends thereof fittingly engaging in the grooves of the posts respectively.

14. The heat sink assembly as described in claim 13, wherein each post forms a step located higher than a top extremity of the fins, and wherein the frame is mounted to the posts by sitting on the steps.

15. A heat sink assembly, comprising:
- a heat sink providing a plurality of fins;
- a frame disposed above the heat sink wherein said frame is spaced from top extremity of the fins with a predetermined distance;
- an opening defined in said frame; and
- a fan located upon said frame and in alignment with said opening, said frame being fastened to said heat sink, and said fan being retainably seated upon the frame; wherein
  said predetermined distance between the frame and the top extremity of the fins provides sufficient air space to achieve optimal heat dissipating efficiency.

* * * * *